United States Patent
McKiernan et al.

(10) Patent No.: US 7,592,622 B2
(45) Date of Patent: Sep. 22, 2009

(54) POLYMERS FOR USE IN ORGANIC ELECTROLUMINESCENT DEVICES

(75) Inventors: Mary McKiernan, Cottenham (GB); Carl Towns, Essex (GB)

(73) Assignee: Merck Patent GmbH, Darmstadt (DE)

( * ) Notice: Subject to any disclaimer, the term of this patent is extended or adjusted under 35 U.S.C. 154(b) by 121 days.

(21) Appl. No.: 11/659,899

(22) PCT Filed: Aug. 11, 2005

(86) PCT No.: PCT/EP2005/008718

§ 371 (c)(1),
(2), (4) Date: Feb. 9, 2007

(87) PCT Pub. No.: WO2006/015862

PCT Pub. Date: Feb. 16, 2006

(65) Prior Publication Data

US 2007/0252139 A1 Nov. 1, 2007

(30) Foreign Application Priority Data

Aug. 11, 2004 (EP) .................................. 04019030

(51) Int. Cl.
H01L 35/24 (2006.01)
(52) U.S. Cl. .................................. 257/40; 257/E51.018
(58) Field of Classification Search .................... 257/40
See application file for complete search history.

(56) References Cited

U.S. PATENT DOCUMENTS

| | | | |
|---|---|---|---|
| 3,717,622 A | 2/1973 | Harper et al. | |
| 5,621,131 A | 4/1997 | Kreuder et al. | |
| 5,679,790 A | 10/1997 | Abe et al. | |
| 6,830,832 B2 * | 12/2004 | Oguma et al. ............... | 428/690 |
| 6,956,095 B2 | 10/2005 | Treacher et al. | |
| 7,348,072 B2 * | 3/2008 | Park et al. ................... | 428/690 |
| 2003/0137214 A1 | 7/2003 | Ishizuka et al. | |
| 2004/0076853 A1 | 4/2004 | Jarikov | |
| 2005/0038223 A1 | 2/2005 | Becker et al. | |
| 2005/0040757 A1 * | 2/2005 | Chen et al. .................. | 313/504 |
| 2006/0058524 A1 | 3/2006 | Falcou et al. | |
| 2006/0229427 A1 | 10/2006 | Becker et al. | |
| 2007/0060736 A1 | 3/2007 | Becker et al. | |

FOREIGN PATENT DOCUMENTS

| | | |
|---|---|---|
| EP | 0707020 | 4/1996 |
| EP | 0949850 | 10/1999 |
| EP | 1318163 | 6/2003 |
| EP | 1344788 | 9/2003 |
| WO | WO-90/13148 | 11/1990 |
| WO | WO-92/03490 | 3/1992 |
| WO | WO-97/05184 | 2/1997 |
| WO | WO-97/42666 | 11/1997 |
| WO | WO-98/05187 | 2/1998 |
| WO | WO-98/06773 | 2/1998 |
| WO | WO-99/48160 | 9/1999 |
| WO | WO-99/54385 | 10/1999 |
| WO | WO-00/53656 | 9/2000 |
| WO | WO-00/55927 | 9/2000 |
| WO | WO-01/49769 | 7/2001 |
| WO | WO-01/66618 | 9/2001 |
| WO | WO-02/23579 | 3/2002 |
| WO | WO-02/26859 | 4/2002 |
| WO | WO-03/020790 A2 | 3/2003 |
| WO | WO-03/048225 | 6/2003 |
| WO | WO-2004/022626 | 3/2004 |
| WO | WO 2004/084260 | 9/2004 |
| WO | WO 2005/014688 | 2/2005 |
| WO | WO 2005/014689 | 2/2005 |

OTHER PUBLICATIONS

D. Marsitzky et al., "Poly-2,8-(indenofluorene-co-anthracene)-A Colorfast Blue-Light Emitting Random Copolymer", *Advanced Materials*, 4 pages (2001).

S. Setayesh et al., "Bridging the Gap between Polyfluorene and Ladder-Poly-p-phenylene: Synthesis and Characterization of Poly-2,8-indenofluorene", Macromolecules 2000, vol. 33, pp. 2016-2020 (2000).

Y. Yang et al., "Efficient blue polymer light-emitting diodes from a series of soluble poly(paraphenylene)s", *J. App. Phys.*, vol. 79 (2), pp. 934-939 (1996).

Reisch, H, et al., "Poly(indenofluorene) (PIF), a Novel Low Band Gap Polyhydrocarbon", Macromolecules, 1996, vol. 29, 8204-8210.

Reisch, H. A. et al., "Poly(indenofluorene)s (PIF)—Novel Conjugated Polyhydrocarbon Polymers", Synthetic Metals, 1999, vol. 101, pp. 128-129.

Grimsdale, A. C. et al., "Correlation Between Molecular Structure, Microscopic Morphology, and Optical Properties of Poly(tetraalkylindenofluorene)s", Advanced Functional Materials, 2002, vol. 12, No. 10, pp. 729-733.

(Continued)

*Primary Examiner*—Wai-Sing Louie
(74) *Attorney, Agent, or Firm*—Connolly Bove Lodge & Hutz LLP

(57) ABSTRACT

A polymer comprising an optionally substituted first repeat unit off formula (1): wherein F is a divalent residue; each G in each occurrence is independently a divalent residue; r is at least 1; each p is independently 0 or 1 and each corresponding q is the other of 0 or 1; and G comprises a heteroatom in the case where n is 1.

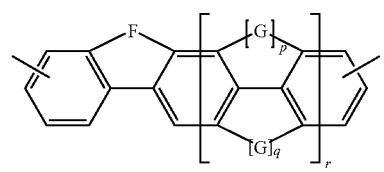

(1)

20 Claims, No Drawings

OTHER PUBLICATIONS

Jacob, J. et al., "Poly(tetraarylindenofluorene)s: New Stable Blue-Emitting Polymers", Macromolecules, 2003, vol. 36, pp. 8240-8245.

Setayesh, S. et al., "Bridging the Gap Between Polyfluorene and Ladder-Poly-*p*-phenylene: Synthesis and Characterization of Poly-2,8-indenofluorene", Macromolecules, 2000, vol. 33, pp. 2016-2020.

Plummer, B. F. et al., "Study of Geometry Effects on Heavy Atom Perturbation of the Electronic Properties of Derivatives of the Nonalternant Polycyclic Aromatic Hydrocarbons Fluoranthene and Acenaphtho[1,2-*k*]fluoranthene", Journal of American Chemical Society, 1993, vol. 115, pp. 11542-11551.

* cited by examiner

POLYMERS FOR USE IN ORGANIC ELECTROLUMINESCENT DEVICES

RELATED APPLICATIONS

The application is a national stage application (under 35 U.S.C. § 371) of PCT/EP2005/008718 filed Aug. 11, 2005, which claims benefit of European application 04019030.8 filed Aug. 11, 2004.

FIELD OF THE INVENTION

The present invention relates to organic semiconductive polymers, monomers for the preparation of such polymers, methods for the preparation of such polymers and the use of such polymers in organic optoelectronic devices.

BRIEF DESCRIPTION OF THE PRIOR ART

Semiconductive organic polymers have been known for several decades. During the past ten years they have found increasing application as transistors and in the field of optoelectronic devices including organic photovoltaic devices (in particular solar cells), organic photodetectors and electroluminescent devices, also known as polymeric light emitting devices, see for example WO90113148.

A polymeric light emitting device comprises a negative charge carrier injecting electrode, a positive charge carrier injecting electrode and a layer of polymeric light emitting material situated between the two electrodes. Application of a voltage between the two electrodes causes positive charge carriers, known as holes, to be injected from the positive charge injecting electrode and negative charge carriers, electrons, to be injected from the negative charge carrier injecting electrode. The holes and electrons combine in the layer of polymeric light emitting material to form an exciton which decays emitting light. The electroluminescent device may also comprise further layers for the transport of charge carriers from the electrodes to the layer of light emitting polymers, and/or the light emitting polymer itself may incorporate charge transporting units in addition to light emissive units.

The nature of the polymeric material used in electroluminescent devices is critical to the performance of the device. Materials used include poly(phenylenevinylenes), as disclosed in WO90/13148, polyfluorenes, as disclosed in WO97/05184 and poly(arylamines) as disclosed in WO98/06773. Copolymers and blends of polymers have been found to be useful in such devices, as disclosed in WO92/03490, WO99/54385, WO00/55927 and WO99/48160. Poly(arylamines) have been disclosed in which the aromatic groups may comprise heteroaromatic moieties such as triazine as disclosed in WO01/49769. In copolymers and blends of polymers different monomer units are used to provide different functions in the device, namely electron transport, hole transport and light emission.

In particular chains of arylene repeat units, such as homopolymers or block copolymers comprising dialkylfluorene repeat units, may be used as electron transporting materials. In addition to their electron transporting properties, polyfluorenes have the advantage of being soluble in conventional organic solvents and have good film forming properties. Furthermore, fluorene monomers are amenable to Yamamoto polymerisation or Suzuki polymerisation which enables a high degree of control over the regioregularity of the resultant polymer.

One example of a polyfluorene based polymer is a blue electroluminescent polymer of formula (a) disclosed in WO 00/55927:

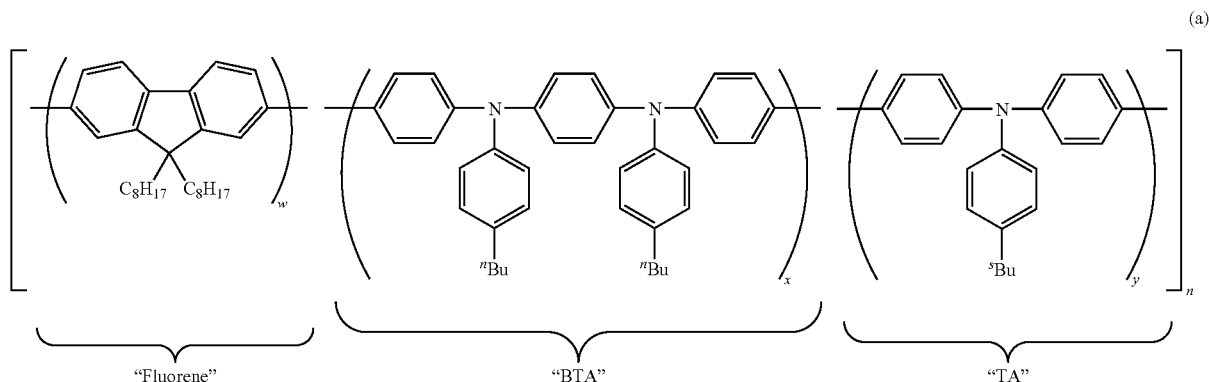

(a)

wherein w+x+y=1, w>0.5, 0≦x+y≦0.5 and n>2.

In this polymer, chains of dioctylfluorene, denoted as Fluorene, function as the electron transport unit; the triphenylamine denoted as TA functions as the hole transport unit and the bis(diphenylamino)benzene derivative denoted as BTA functions as the emissive unit.

There are a number of disadvantages associated with fluorene based polymers which have led to a search for alternative electron transporting and light emitting units. These disadvantages include the limited hole transporting ability of the fluorene units, the tendency of fluorene units to aggregate and the fact that when blue light emission occurs from fluorene based polymers the emission does not occur in the region of the electromagnetic spectrum in which the human eye is most sensitive.

In an effort to provide alternatives to fluorene based polymers, light emitting polymers comprising the tetraoctyl substituted trans-indenofluorene (trans-IF) units shown in formula (b) below have been described in Marsitzky et al, Advanced Materials, 2001, 13, 1096-1099.

(b)

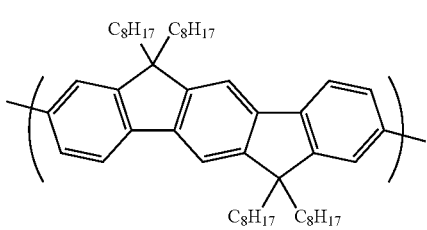

Polymers comprising such tetraoctyl trans-indenofluorene units are described as having a bathochromically shifted emission wavelength which leads to a blue emission colour matched to the sensitivity of the human eye. These polymers are formed by polymerisation of the corresponding dibromo-monomer in the presence of a nickel catalyst. EP 1344788 discloses conjugated polymers comprising dibenzothiophene or dibenzofuran units and their use in polymer LEDs. These fluorene analogues comprise bridging O or S atoms. EP 1318163 discloses fluorene analogues comprising bridging P or Si atoms. In both cases, the bridging atom is a heteroatom.

Ladder polymer repeat units are described in U.S. Pat. No. 5,679,790.

SUMMARY OF THE INVENTION

The aim of the present invention is to solve one or more of the problems outlined above.

The present inventors have developed new diindenofluorene monomers, heteroatomic analogues thereof, and polymers comprising said monomers, which are readily processable while having excellent electrical and optical properties.

Accordingly, in a first aspect the invention provides a polymer comprising an optionally substituted first repeat unit of formula (1):

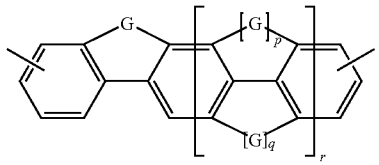

(1)

wherein each G in each occurrence is independently a divalent residue;
r is at least 1;
each p is independently 0 or 1 and each corresponding q is the other of 0 or 1; and
G comprises a heteroatom in the case where n is 1.
Optionally, r is at least 2.
Optionally, each G is independently selected from the group consisting of $CR_2$, NR, PR, POR, BR, O, S, SO, $SO_2$ and $SiR_2$ wherein each R independently represents H or a substituent. In the case of $CR_2$ and $SiR_2$ the two R groups may be joined to form a ring.

In the case where r=1, each G is preferably independently selected from the group consisting of NR, PR, POR, BR, O, S, SO, $SO_2$ and $SiR_2$.

In the case where r>1, each G is preferably independently selected from the group consisting of $CR_2$, NR, PR, POR, BR, O, S, SO, $SO_2$ and $SiR_2$ wherein R is as described above.

In one preferred embodiment, R is in each occurence independently selected from hydrogen, $C_1$ to $C_{40}$ alkyl, alkoxy, aryl, aryloxy, heteroaryl and heteroaryloxy.

In another preferred embodiment, at least one G is $CR_2$ or $SiR_2$ and the R groups are linked to form a ring.

Optionally, the polymer comprises a second repeat unit. Preferred second repeat units are optionally substituted triarylamines and heteroaromatics.

In one preferred embodiment, at least two adjacent divalent residues G are in a cis-configuration relative to each other.

In one preferred embodiment, at least two adjacent divalent residues G are in a trans-configuration relative to each other.

In a second aspect, the invention provides a monomer comprising an optionally substituted compound of formula (2):

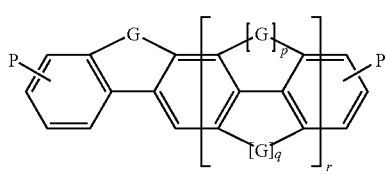

(2)

G in each occurrence is independently a divalent residue;
r is at least 1;
each p is independently 0 or 1 and each corresponding q is the other of 0 or 1;
each P-independently represents a polymerisable group; and
G comprises a heteroatom in the case where n is 1.

The preferred features of the monomer of formula (2) are as set forth above for repeat units of formula (1).

Advantageous polymerisation techniques for the monomer include Suzuki and Yamamoto polymerisations which operate via a "metal insertion" wherein the metal atom of a metal complex catalyst is inserted between an aryl group and a leaving group of a monomer. Therefore, each P preferably represents a leaving group capable of participating in a polycondensation mediated by a metal of variable oxidation state.

In a preferred arrangement, r=2 and the monomer comprises an optionally substituted compound of formula (5):

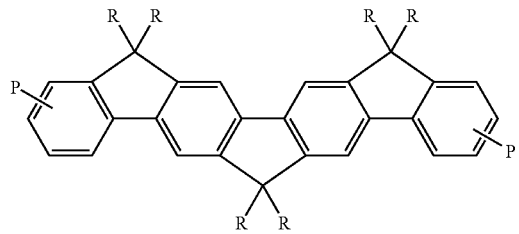

(5)

In another preferred arrangement, r=3 and the monomer comprises an optionally substituted compound of formula (6):

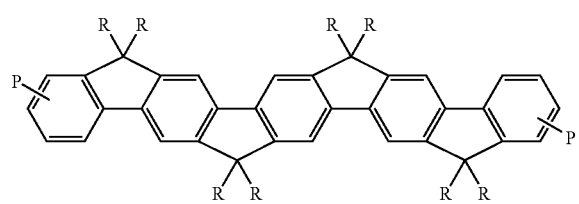

(6)

Monomers (3) and (4), and repeat units derived therefrom, are trans-structures. Monomers and repeat units according to the invention may also be cis-isomers. For example, a cis-isomer wherein n=2 is given by formula (7) below:

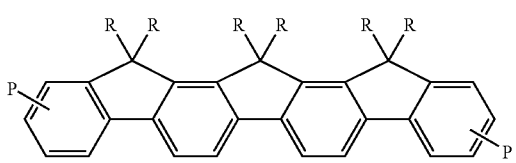

(7)

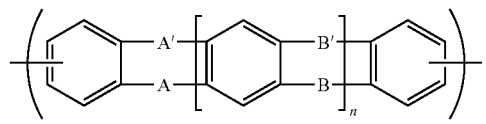

(8)

In a third aspect, the invention provides a process for preparing a polymer comprising a step of reacting a first monomer as described in the second aspect of the invention and a second monomer that may be the same or different from the first monomer under conditions so as to polymerise the monomers.

Optionally, the process comprises polymerising in a reaction mixture:

(a) a monomer according to the second aspect of the invention wherein each P is a boron derivative functional group selected from a boronic acid group, a boronic ester group and a borane group, and an aromatic monomer having at least two reactive functional groups independently selected from halides or a moiety of formula —O—SO$_2$-Z; or (b) a monomer according to the second aspect of the invention wherein each P is independently selected from the group consisting of reactive halide functional groups and moieties of formula —O—SO$_2$-Z, and an aromatic monomer having at least two boron derivative functional groups selected from boronic acid groups, boronic ester groups and borane groups; or (c) a monomer according to the second aspect of the invention wherein one P is a reactive halide functional group or a moiety of formula —O—SO$_2$-Z and the other P is a boron derivative functional group selected from a boronic acid group, a boronic ester group and a borane group, wherein the reaction mixture comprises a catalytic amount of a catalyst suitable for catalysing the polymerisation of the aromatic monomers.

In a fourth aspect, the invention provides an organic electronic device comprising a polymer according to the first aspect of the invention.

Optionally, the polymer of the device of the fourth aspect of the invention is located in a layer between a first electrode for injection of holes and a second electrode for injection of electrons.

In one embodiment, the organic electronic device is an electroluminescent device.

In another embodiment, the organic electronic device is a switching device. The switching device may be a field effect transistor comprising an insulator having a first side and a second side; a gate electrode located on the first side of the insulator; a polymer according to the first aspect of the invention located on the second side of the insulator; and a drain electrode and a source electrode located on the oligomer or polymer.

In a fifth aspect, the invention provides an integrated circuit comprising a field effect transistor as described above.

According to a sixth aspect of the present invention there is provided a polymer comprising an optionally substituted first repeat unit of formula (8):

wherein A is one of a bond or a divalent residue and A' is the other of a bond and a divalent residue;
  each B is independently one of a bond or a divalent residue and each corresponding B' is independently the other of a bond and a divalent residue;
  n is at least 1; and the B or B' that is a divalent residue comprises a heteroatom in the case where n is 1.

Optionally, n is at least 2, preferably 2 or 3.

Optionally, the A or A' that is a divalent residue is selected from the group consisting of CR$_2$, NR, PR, POR, BR, O, S, SO, SO$_2$ and SiR$_2$ wherein each R independently represents H or a substituent.

Optionally, in the case where n=1 the B or B' that is a divalent residue is selected from the group consisting of NR, PR, POR, BR, O, S, SO, SO$_2$ and SiR$_2$.

Optionally, in the case where n>1 the B or B' that is a divalent residue is selected from the group consisting of CR$_2$, NR, PR, POR, BR, O, S, SO, SO$_2$ and SiR$_2$.

Optionally, R is in each occurence independently selected from hydrogen, C$_1$ to C$_{40}$ alkyl, alkoxy, aryl, aryloxy, heteroaryl and heteroaryloxy.

Optionally, at least one divalent residue is CR$_2$ or SiR$_2$ and the R groups are linked to form a ring.

Optionally, the polymer according to the sixth aspect comprises a second repeat unit.

Optionally, said second repeat unit is selected from optionally substituted triarylamines and heteroaromatics.

According to a seventh aspect of the present invention there is provided a monomer comprising an optionally substituted compound of formula (9):

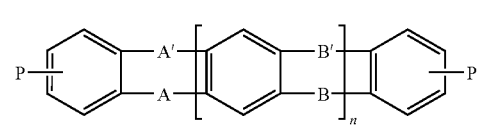

(9)

wherein A is one of a bond or a divalent residue and A' is the other of a bond and a divalent residue;
  each B is independently one of a bond or a divalent residue and each corresponding B' is independently the other of a bond and a divalent residue;
  each P independently represents a polymerisable group;
  n is at least 1; and
  the B or B' that is a divalent residue comprises a heteroatom in the case-where n is 1.

Optionally, n is at least 2, preferably 2 or 3.

Optionally, the A or A' that is a divalent residue is selected from the group consisting of CR$_2$, NR, PR, POR, BR, O, S, SO, SO$_2$ and SiR$_2$ wherein each R independently represents H or a substituent.

Optionally, in the case where n=1 the B or B' that is a divalent residue is selected from the group consisting of NR, PR, POR, BR, O, S, SO, SO$_2$ and SiR$_2$.

Optionally, in the case where n>1 the B or B' that is a divalent residue is selected from the group consisting of $CR_2$, NR, PR, POR, BR, O, S, SO, $SO_2$ and $SiR_2$.

Optionally, R is in each occurence independently selected from hydrogen, $C_1$ to $C_{40}$ alkyl, alkoxy, aryl, aryloxy, heteroaryl and heteroaryloxy.

Optionally, at least one divalent residue is $CR_2$ or $SiR_2$ and the R groups are linked to form a ring.

Optionally, each P is independently selected from a reactive boron derivative group selected from a boronic acid group, a boronic ester group and a borane group; a reactive halide group or a moiety of formula —O—$SO_2$-Z wherein Z is selected from the group consisting of optionally substituted alkyl and aryl.

According to an eighth aspect of the present invention there is provided a process for preparing a polymer comprising a step of reacting a first monomer as described in the seventh aspect of the invention and a second monomer that may be the same or different from the first monomer under conditions so as to polymerise the monomers.

Optionally, the process is performed in the presence of a nickel or palladium compound catalyst and each P represents a leaving group capable of participating in a polycondensation mediated by a metal of variable oxidation state Optionally, the process comprises polymerising in a reaction mixture:

(a) a monomer according to the seventh aspect of the invention wherein each P is a boron derivative functional group selected from a boronic acid group, a boronic ester group and a borane group, and an aromatic monomer having at least two reactive functional groups independently selected from halides or a moiety of formula —O—$SO_2$-Z ; or (b) a monomer according to the seventh aspect of the invention wherein each P is independently selected from the group consisting of reactive halide functional groups and moieties of formula —O—$SO_2$-Z, and an aromatic monomer having at least two boron derivative functional groups selected from boronic acid groups, boronic ester groups and borane groups; or (c) a monomer according to the seventh aspect of the invention wherein one P is a reactive halide functional group or a moiety of formula —O—$SO_2$-Z and the other P is a boron derivative functional group selected from a boronic acid group, a boronic ester group and a borane group, wherein the reaction mixture comprises a catalytic amount of a catalyst suitable for catalysing the polymerisation of the aromatic monomers.

According to a ninth aspect of the present invention there is provided an organic electronic device comprising a polymer as defined in the sixth aspect of the invention.

Optionally, the polymer is located in a layer between a first electrode for injection of holes and a second electrode for injection of electrons.

Optionally, the organic electronic device is an electroluminescent device.

Optionally, the organic electronic device is a switching device.

According to a tenth aspect of the present invention there is provided a field effect transistor comprising an insulator having a first side and a second side; a gate electrode located on the first side of the insulator; a polymer as previously defined located on the second side of the insulator; and a drain electrode and a source electrode located on the oligomer or polymer.

According to a eleventh aspect of the present invention there is provided an integrated circuit comprising a field effect transistor according to the tenth aspect of the invention.

In embodiments of the present invention, one or more bridging carbon atoms can be retained as the divalent residue so as to retain solubility comparable to prior art fluorene or indenofluorene units whilst still obtaining the advantage of including heteroatoms such as oxygen and sulfur. Furthermore, because these compounds have at least 3 bridging positions in the case where the bridging atom is carbon, the option to substitute one or more bridging carbons gives more control in tuning the properties of the repeat unit such as solubility and glass transition temperature.

The large coplanar backbone of the repeat units provides good electron transport. When compared to simple indenofluorene analogues (such as tetraoctyl indenofluorene (T8IF)) the HOMO level is slightly shallower (ca. 0.15 eV closer to the vacuum level) and the LUMO level is deeper (ca. 0.15 eV) than the corresponding IF units. Therefore, the band gap of the new monomer units is not as wide and the LUMO level is more closely matched to work with a common cathode, such as barium. Therefore, these units demonstrate a clear advantage as regards electron injection and electron transport.

DETAILED DESCRIPTION OF THE INVENTION

The present inventors have developed new diindenofluorene monomers and heteroatomic analogues thereof as shown below:

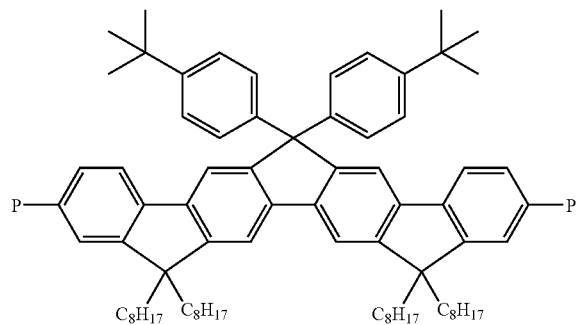

P = Br or boronic ester

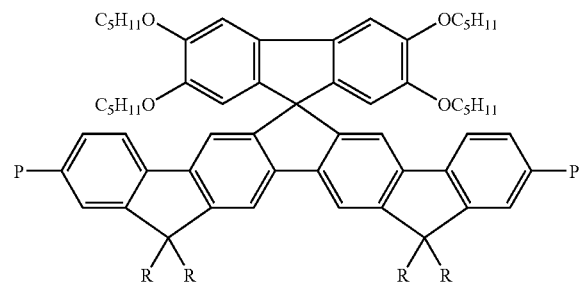

P = Br or boronic ester

R = 4-$^t$Bu-Phenyl

-continued
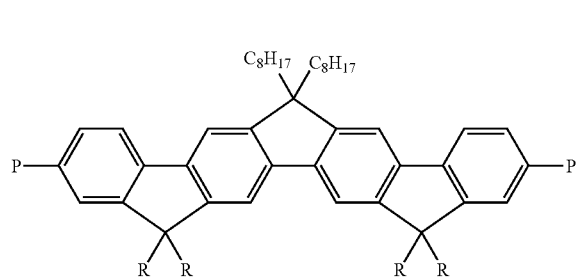
P = Br or boronic ester
R = 4-$^t$Bu-Phenyl
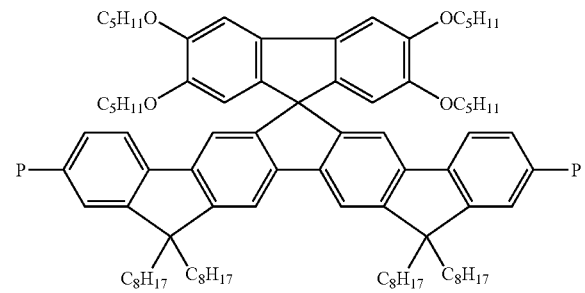
P = Br or boronic ester
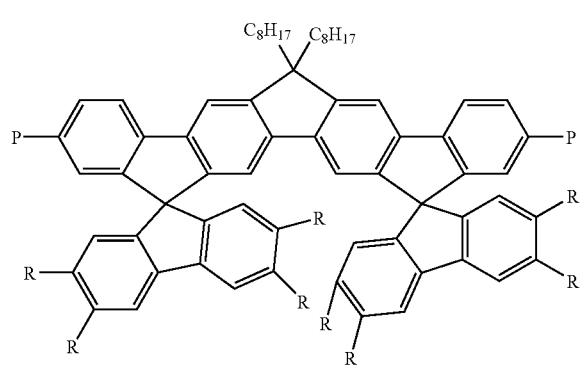
P = Br or boronic ester;
R = iso-OC5H11
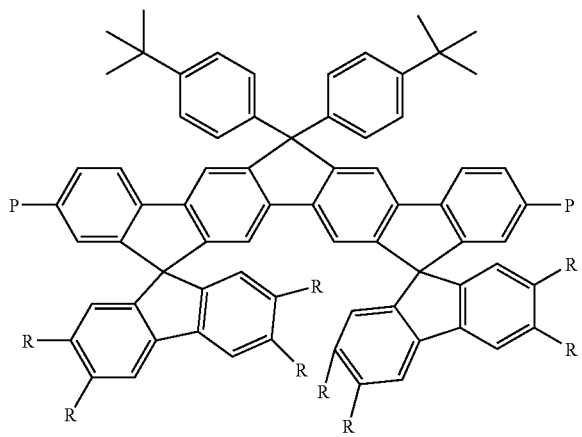
P = Br or boronic ester;
R = iso-OC5H11
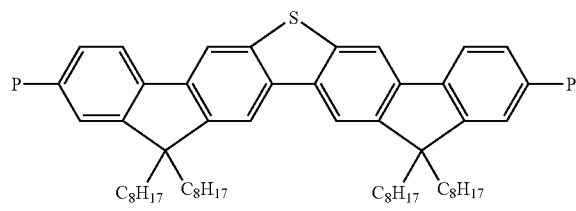
P = Br or boronic ester;
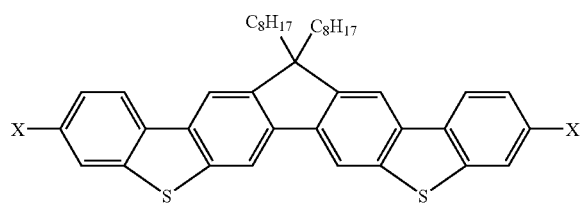
P = Br or boronic ester;
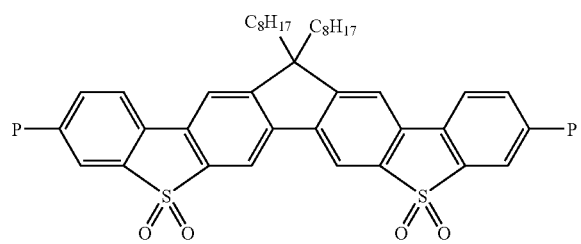
P = Br or boronic ester;

The present inventors have further developed new heteroatom substituted analogues of indenofluorene. Examples for these monomers are shown below.

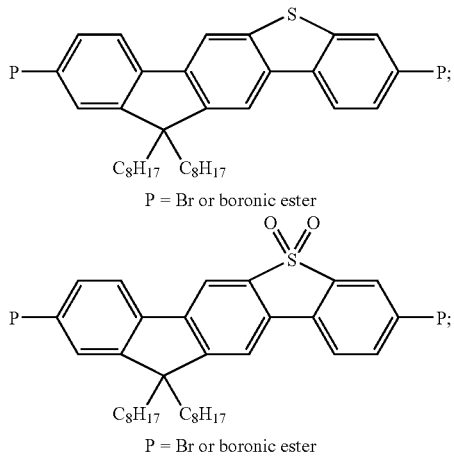

P = Br or boronic ester

P = Br or boronic ester

Preferred methods for polymerisation of the above-described monomers so as to produce polymers are Suzuki polymerisation as described in, for example, WO 00/53656 and WO 03/048225, and Yamamoto polymerisation as described in, for example, T. Yamamoto, "Electrically Conducting and Thermally Stable pi-Conjugated Poly(arylene)s Prepared by Organometallic Processes",Progress in Polymer Science 1993, 17, 1153-1205 and WO 04/022626, or Stille coupling. For example, in the synthesis of a linear polymer by Yamamoto polymerisation, a monomer having two reactive halide groups P is used. Similarly, according to the method of Suzuki polymerisation, at least one reactive group P is a boron derivative group.

Suzuki polymerisation may be used to prepare regioregular, block and random copolymers. In particular, random copolymers may be prepared when one reactive group P is a halogen and the other reactive group P is a boron derivative group. Alternatively, block or regioregular, in particular AB, copolymers may be prepared when both reactive groups of a first monomer are boron derivatives and both reactive groups. of a second monomer are halide. The synthesis of polymers with blocky structures is described in detail in, for example, WO 05/014688.

Suzuki polymerisation employs a Pd(0) complex or a Pd(II) salt. Preferred Pd(0) complexes are those bearing at least one phosphine ligand such as $Pd(Ph_3P)_4$. Another preferred phosphine ligand is tris(orthotolyl)phosphine, i.e. $P(o-Tol)_3$. Preferred Pd(II) salts include palladium acetate, i.e. $Pd(OAc)_2$. Suzuki polymerisation is performed in the presence of a base, for example sodium carbonate, potassium phosphate or an organic base such as tetraethylammonium carbonate.

Yamamoto polymerisation employs a Ni(0) complex, for example bis(1,5-cyclooctadienyl) nickel(0).

As alternatives to halogens as described above, leaving groups of formula $—O—SO_2Z$ can be used wherein Z is selected from the group consisting of optionally substituted alkyl and aryl. Particular examples of such leaving groups are tosylate, mesylate and triflate.

In the case of Suzuki polymerisations, numerous other combinations of reactive groups P for the two monomers used will be apparent to the skilled person. These include:
boronic acids or esters with trialkylsiloxy groups;
boronic acids or esters with diazonium tetrafluoroborates (Tetrahedron Letters, 1997, Vol 38, No 25, pp 4393-4396);

diazonium tetrafluoroborates with metal trifluoroborates (Tetrahedron Letters, 1997, Vol 38, No 25, pp 4393-4396); and
metal trifluoroborates with aryl halides using ligand free palldium (e.g. palladium acetate) (Organic Letters, 2002, Vol 4, No 11, pp 1867-1870).

Providing pendant groups comprising one or more alkyl chains having 4 to 12 carbon atoms may improve the solubility of the polymers and also limit aggregation of the polymer chains.

Pendant groups may also be substituted with fluoro or fluoroalkyl groups. In particular long chain perfluoroalkyl substituents are considered to reduce aggregation of the polymer chains. A further advantage of fluoro and fluoroalkyl substituted aryl groups is that the electron withdrawing properties of these groups may increase the LUMO of the polymer and so enable more efficient electron injection into the polymer.

The aryl groups may be substituted with other aryl groups such as phenyl and substituted phenyl groups.

The monomer according to the invention may be polymerised alone to form a homopolymer or in the presence of one or.more co-monomers to form a co-polymer. Possible co-repeat units derived from such co-monomers are outlined below; it will be appreciated that each of these co-repeat units may be derived from a comonomer comprising two polymerisable groups independently selected from halogen (preferably chlorine, bromine or iodine, more preferably bromine), a boronic acid group, a boronic ester group and a borane group. The use of monomers with different electronic properties in copolymers allows a greater degree of control over the electronic and light emissive properties of the polymer.

A wide range of comonomers for polymerisation with the monomers of the invention will be apparent to the skilled person. One class of co-repeat units are arylene repeat units, in particular: 1,4-phenylene repeat units as disclosed in J. Appi. Phys. 1996, 79, 934; fluorene repeat units as disclosed in EP 0842208, trans-indenofluorene repeat units as disclosed in, for example, Macromolecules 2000, 33(6), 2016-2020; cis-indenofluorene repeat units as described in EP 03014042.0; spirobifluorene repeat units as disclosed in, for example, EP 0707020; dihydrophenanthrene repeat units as disclosed in WO 05/014689 and stilbene repeat units (commonly known as "OPV" repeat units) as disclosed in WO 03/020790. Each of these repeat units is optionally substituted. Examples of substituents include solubilising groups such as $C_{1-20}$ alkyl or alkoxy; electron withdrawing groups such as fluorine, nitro or cyano; and substituents for increasing glass transition temperature (Tg) of the polymer such as bulky groups, e.g. tert-butyl or optionally substituted aryl groups.

A further class of preferred corepeat units are repeat units comprising one or more amino groups in the repeat unit backbone such as co-repeat units comprising triarylamine groups, in particular repeat units of formulae 6-8:

6

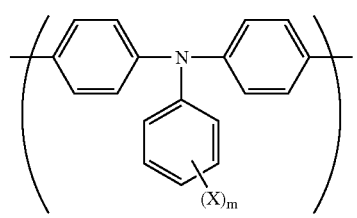

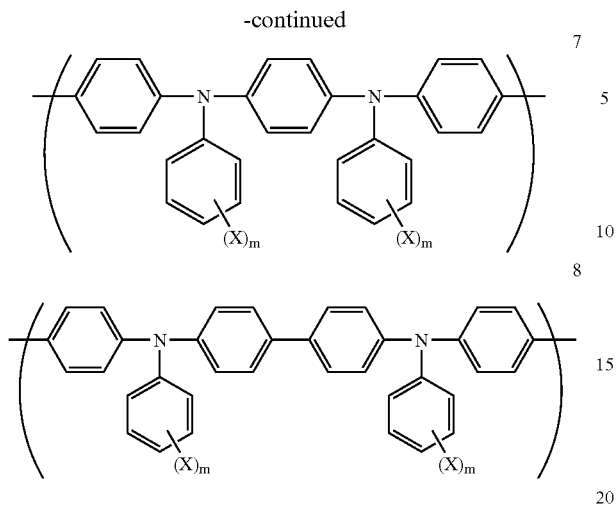

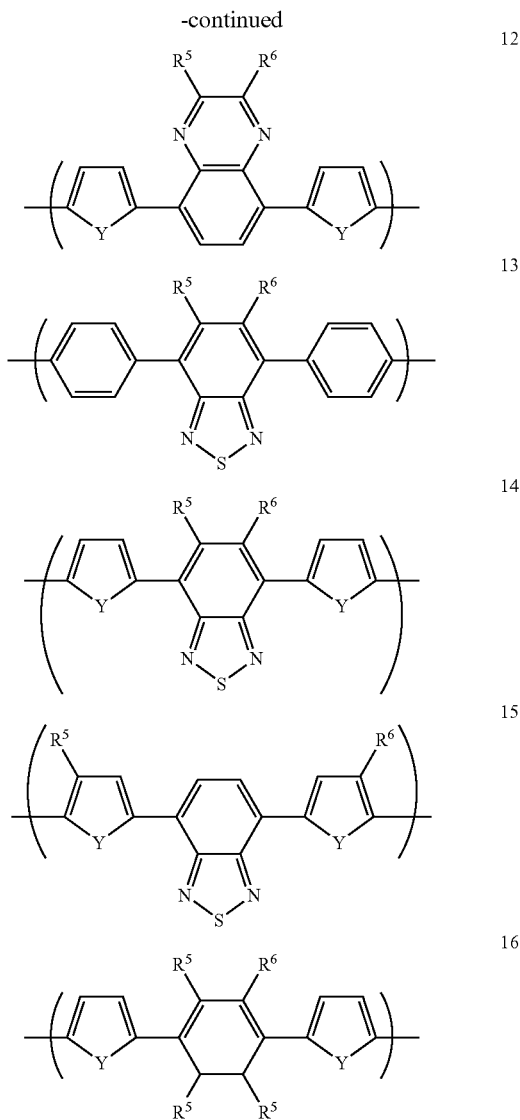

wherein X in each occurrence is independently hydrogen or a substituent and m is 1-3. Preferably at least one X is independently selected from the group consisting of alkyl, aryl, perfluoroalkyl, thioalkyl, cyano, alkoxy, heteroaryl, alkylaryl and arylalkyl groups. Particularly preferred groups X are n-alkyl (in particular n-butyl), branched alkyl (in particular s-butyl and t-butyl), a n-alkoxy or a trifluoroalkyl (in particular trifluoromethyl) group because they are suitable for helping to select the HOMO level and/or for improving solubility of the polymer. Preferably, m is 1 or 2, more preferably 1. Preferably, where X is a substituent it is located in the meta- or para-position, most preferably in the para-position.

Use of trifluoromethyl groups in repeat units of this type is disclosed in WO 01/66618. A yet further class of co-repeat units include heteroaryl repeat units such as optionally substituted 2,5-thienyl, pyridyl, diazine, triazine, azole, diazole, triazole, oxazole or oxadiazole; or optionally substituted units of formulae 9-16:

wherein each Y represents sulfur or oxygen, preferably sulfur; and $R^5$ and $R^6$ are the same or different and are each independently hydrogen or a substituent group. Preferably, one or more of $R^5$ and/or $R^6$ may be selected from hydrogen, $C_1$ to $C_{40}$ alkyl, aryl, perfluoroalkyl, thioalkyl, cyano, alkoxy, heteroaryl, alkylaryl, or arylalkyl. Most preferably, $R^5$ and $R^6$ are independently hydrogen, $C_1$ to $C_{20}$ alkyl or phenyl. Preferably, for practical reasons, $R^5$ and $R^6$ are the same when both are a substituent.

The diindenofluorene monomers and heteroatomic analogues of the present invention have particular application in electronic and optical devices, in particular organic light emitting devices.

When used in an OLED, polymers according to the invention possess at least one of hole transporting, electron transporting and emissive properties. Where the polymer has more than one of these properties, different properties may be provided by different monomer repeat units or segments of a block co-polymer, in particular segments of the polymer backbone as described in WO 00/55927 or pendant groups as described in WO 02/26859. Alternatively, if the polymer of the invention has only one or two of the properties of hole transport, electron transport and emission, it may be blended with one or more further polymers, oligomers or low molecular weight compounds having the remaining required property or properties as described in WO 99/48160.

Organic light emitting devices comprise a layered structure comprising a lower electrode situated on a substrate for injection of charge carriers of a first type, an upper electrode for injection of charge carriers of a second type and a layer of organic light emitting material located between the lower and upper electrodes. Additionally, charge transporting layers of organic material may also be located between the electrodes. When a voltage is supplied across the electrode of the device opposite charge carriers, namely electrons and holes, are injected into the organic light emitting material. The electrons and holes recombine in the layer of organic light emitting material resulting in the emission of light. One of the electrodes, the anode, comprises a high work function material suitable for injecting holes into the layer of organic light emitting material, this material typically has a work function of greater than 4.3 eV and may be selected from the group comprising indium-tin oxide (ITO), tin oxide, aluminum or indium doped zinc oxide, magnesium-indium oxide, cadmium tin-oxide, gold, silver, nickel, palladium and platinum. The anode material is usually deposited by sputtering or vapour deposition as appropriate.

The other electrode, the cathode, comprises a low work function material suitable for injecting electrons into the layer of organic light emitting material. The low work function material typically has a work function of less than 3.5 eV and may be selected from the group including Li, Na, K, Rb, Be, Mg, Ca, Sr, Ba, Yb, Sm and Al. The cathode may comprise an alloy of such metals or an alloy of such metals in combination with other metals, for example the alloys MgAg and LiAl. The cathode preferably comprises multiple layers, for example Ca/Al, Ba/Al or LiAl/Al. The device may further comprise a layer of dielectric material between the cathode and the emitting layer, such as is disclosed in WO 97/42666. In particular it is preferred to use an alkali or alkaline earth metal fluoride as a dielectric layer between the cathode and the emitting material. A particularly preferred cathode comprises LiF/Ca/Al, with a layer of LiF of thickness from 1 to 10 nm, a layer of Ca of thickness of 1 to 25 nm and a layer of Al of thickness 10 to 500 nm. Alternatively a cathode comprising $BaF_2$/Ca/Al may be used. The cathode materials are usually deposited by vacuum deposition.

For light emission to occur from the device it is preferred that either the cathode, the anode or both are transparent or semi-transparent. Suitable materials for transparent anodes include ITO and thin layers of metals such as platinum. Suitable materials for transparent cathodes include a thin layer of electron injecting material in proximity to the layer of organic light emitting material and a thicker layer of transparent conductive material overlying the layer of electron injecting material e.g. a cathode structure comprising Ca/Au. Where neither the cathode nor the anode is transparent or semi-transparent light emission occurs through. the edge of the device. It will be appreciated that such transparency is not a requirement where the polymers of the invention are used in switching devices.

A PLED may be a static image device, i.e. a device that displays only a single image. In the simplest case, the device comprises an anode, cathode and electroluminescent polymer, each of which are unpatterned. Such a device may be suitable for lighting applications or signs displaying a fixed image. Alternatively, the device may be a variable image device, i.e. a device wherein different areas of the electroluminescent layer may be independently addressed. Such a device may be a segmented, passive matrix or active matrix device.

The polymers of the present invention may comprise the light emissive layer of the device or may comprise an electron transport layer of the device. The polymers may be. deposited by any suitable method although solution deposition methods are preferred. Solution deposition techniques include spin-coating, dip-coating, doctor blade coating, screen printing, flexographic printing and ink-jet printing. Ink-jet printing is particularly preferred as it allows high resolution displays to be prepared.

The organic light emitting device may include further organic layers between the anode and cathode to improve charge injection and device efficiency. In particular a layer of hole-transporting material may be situated over the anode. The hole-transport material serves to increase charge conduction through the device. The preferred hole-transport material used in the art is the conductive organic polymer polystyrene sulfonic acid doped polyethylene dioxythiophene (PEDOT: PSS) as disclosed in WO98/05187. Other hole transporting materials such as doped polyaniline or TPD (N,N'-diphenyl-N,N'-bis(3-methylphenyl)[1,1'-biphenyl]-4,4'-diamine) may also be used. A layer of electron transporting or hole blocking material may be positioned between the layer of light emitting material and the cathode if required to improve device efficiency. A layer of hole transporting or electron blocking material may be positioned between the layer of light emitting material and the layer of hole injection material as disclosed in WO 04/084260.

The substrate of the organic light emitting device should provide mechanical stability to the device and act as a barrier to seal the device from the environment. Where it is desired that light enters or leaves the device through the substrate, the substrate should be transparent or semi-transparent. Glass is widely used as a substrate due to its excellent barrier properties and transparency. Other suitable substrates include ceramics, as disclosed in WO02/23579 and plastics such as acrylic resins, polycarbonate resins, polyester resins, polyethylene terephthalate resins and cyclic olefin resins. Plastic substrates may require a barrier coating to ensure that they remain impermeable. The substrate may comprise a composite material such as the glass and plastic composite disclosed in EP0949850.

The organic light emitting device is provided with an encapsulation means which acts to seal the device from the atmosphere. Suitable methods of encapsulation include covering the device on the cathode side with a metal can or glass sheet or providing an impermeable film over the device, such as a film comprising a stack of polymer layers and inorganic layers.

Other organic electronic devices are also covered such switching devices including thin film transistors, field effect transistors, semi-conductor devices, integrated circuits comprising such devices and organic solar cells.

The procedure for the synthesis of monomers according to the invention is discussed in the examples below. It will be understood that these examples illustrate a general method which can be applied to all the other analogues.

EXAMPLES

1. Procedures for the Synthesis of Monomer 1

The overall synthetic sequence for the synthesis of Monomer 1 is as follows

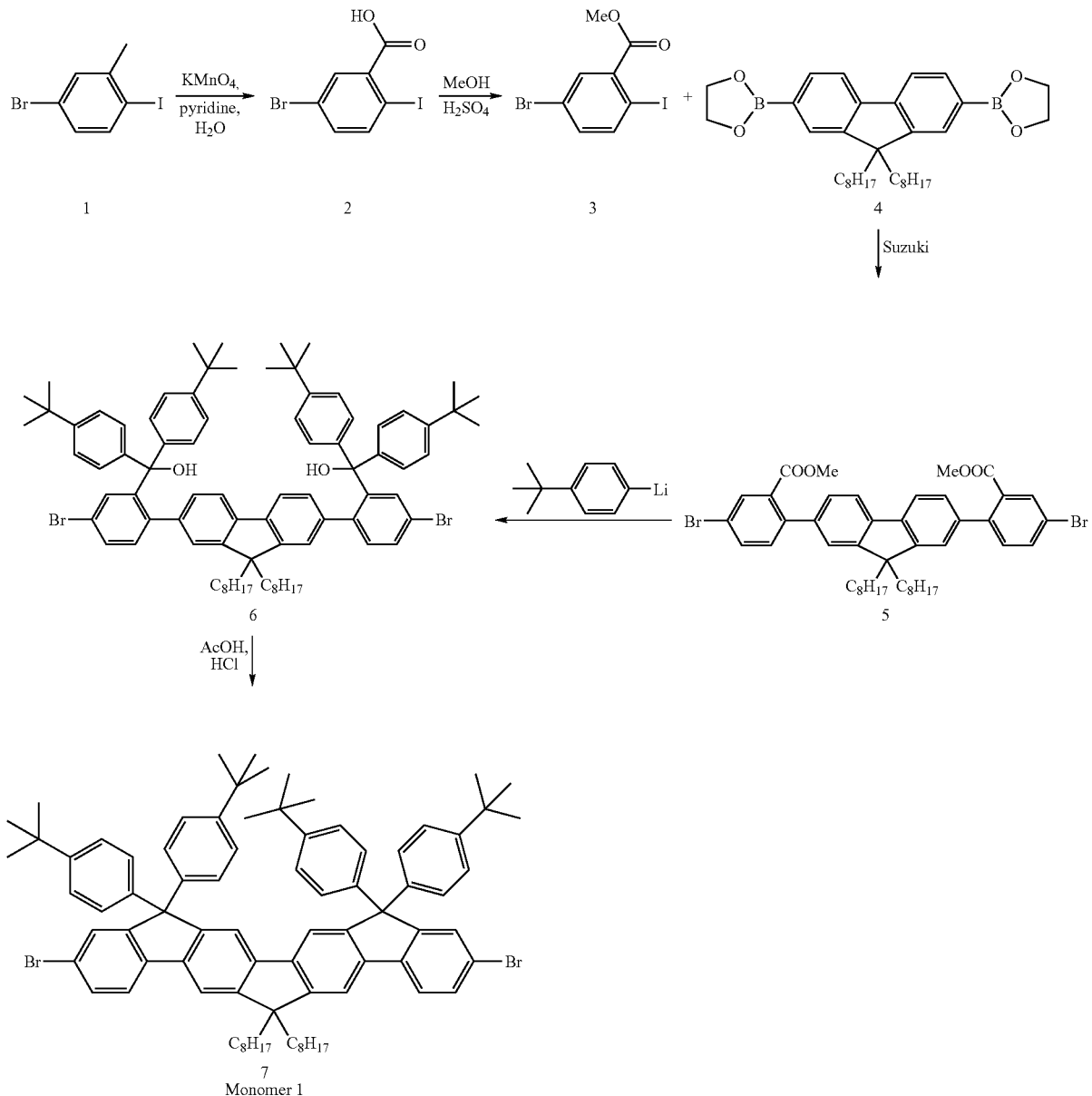

The individual steps in the above synthetic sequence are described below.

2-Iodo-5-bromo-1-benzoic Acid (2)

To a 100 mL round bottom flask was added 5-bromo-2-iodotoluene (1) (10.0 g, 33:7 mmol, 1.0 eq.), pyridine (100 mL), deionised water (10 mL) and potassium permanganate (13.31 g, 84.3 mmol, 2.5 eq.). The flask was fitted with a reflux condenser, mechanical overhead stirrer and nitrogen inlet/exhaust. The mixture was heated to reflux under nitrogen (oil bath 100° C.). After 5 hours at reflux, thin layer chromatography (TLC) indicated some starting material remained, so a further 1.3 eq. of potassium permanganate was added and the mixture allowed to reflux for a further 16 hours. TLC after this time indicated some starting material remained, so a further 1.3 eq. of permanganate was added and the temperature of the oil bath raised to 110° C. After a further 4 hours at the increased temperature, TLC indicated the reaction to be complete.

The mixture was allowed to cool to room temperature and poured into 200 mL of toluene and 300 mL of deionised water. The phases were separated and the organic phase extracted with a further 200 mL of deionised water. The aqueous phases were combined and acidified with hydrochloric acid (10M, 120 mL), until the pH was <3 and a solid formed. The resulting precipitate was stirred for 30 mins at room temperature.

The purple solid was then basified with aqueous sodium carbonate solution and the solution passed through a plug of celite (RTM) filter agent to remove the excess permanganate. The filtrates were acidified with hydrochloric acid to afford a white solid which was recovered by filtration using Buchner apparatus. The cake was washed with water (500 mL) and allowed to air dry. The white solid was then dried in the vacuum oven at 50° C. for 24 hours. The white solid product 2 was analysed by $^1$H NMR (D8-THF): δ=7.42 (dd, 1H, ArHa), 7.84 (s, 1H, ArHb), 7.95 (dd, 1H, ArHc). Yield: 4.0 g, 36%.

Methyl-2-iodo-5-bromo-1-benzoate (3)

The benzoic acid (2) from stage 1 (4.0 g) was dissolved in MeOH (250 mL) in a 500 ML round bottom flask equipped with magnetic stirrer bar, reflux condenser and nitrogen inlet/exhaust. To this was carefully added concentrated sulfuric acid (12M, 2 mL) and the solution brought to reflux for 16 hours. TLC after this time indicated complete consumption of the starting material.

The solution was allowed to cool to ambient temperature and the solvent removed in vacuo. Toluene was added (100 mL) and 20% aqueous sodium carbonate solution (20 mL) and the phases separated. The aqueous phase was re-extracted with toluene (100 mL) and the combined organic phases washed with water, dried over magnesium sulphate, filtered (to remove the drying agent) and the toluene removed from the filtrates in vacuo. The product 3 was afforded as an oil (3.05 g, 73%). Analysis by GCMS showed 100% purity and HPLC showed 99.8% purity at a retention time of 8.3 minutes. $^1$H NMR (D6-DMSO): δ=3.86 (s, 3H, —OMe), 7.42 (dd, 1H, ArHa), 7.84 (s, 1H, ArHb), 7.95 (dd, 1H, ArHc).

Suzuki Coupling of 3 and 4 to give diester 5

To a 100 mL three-necked round bottom flask, equipped with reflux condenser, nitrogen inlet/exhaust, mechanical overhead stirrer and sparge inlet was added the dioctylfluorene bis(boronic) ester (4) (2.25 g, 4.2 mmol, 1.0 eq.), the methyl ester (3) (3.05 g, 8.9 mmol, 2.1 eq.), toluene (25 mL) and Aliquat (RTM) 336 (0.5 mL). The resulting solution was degassed at room temperature for 1 hour by sparging with nitrogen gas. The catalyst, tetrakis(triphenylphosphine)palladium(0), (0.17 g, 3mol % of 3) was added and the solution stirred under nitrogen for 15 mins at room temperature. Sodium carbonate solution (1.53 g, 14.4 mmol, 3.0 eq. in 15 mL deionized water) was added and the mixture heated to 95° C. (oil bath) under nitrogen with rapid stirring.

After 16 h, TLC indicated incomplete reaction, so a further 0.17 g of catalyst was added and the solution stirred at 95° C. for a further 6 h. After this time, TLC indicated the reaction to be incomplete, so the reaction was heated at 95° C. for a further 72 h.

The mixture was allowed to cool to room temperature and the phases separated. The organic phase was passed through a plug of celite (RTM) to remove palladium black and the filtrates concentrated to dryness in vacuo.

The product 5 was purified using column chromatography with hexanes as eluant. This afforded a main fraction of 1.8 g of product 5 as a white solid (52%) and a further 0.5 g of product at lower purity.

HPLC analysis of the main fraction indicated 98% purity at a retention time of 12.2 minutes.

$^1$H NMR (CDCl$_3$): δ=0.83 (t, 6H, CH$_2$-CH$_3$), 1.15 (s, br, 24H, —(CH$_2$)$_n$—), 1.20 (t, 4H, —CH$_2$-fluorene), 1.95 (dt, 4H, —CH$_2$—CH$_3$), 3.61 (s, 6H, —OMe), 7.22 (s, 2H, Ar), 7.28 (d, 2H, Ar), 7.35 (d, 2H, Ar), 7.65 (dd, 2H, Ar), 7.75 (dd, 2H, Ar), 7.97(s, 2H, Ar).

Arylation of 5 to afford diol 6

To a 100 mL round bottom flask equipped with magnetic stirrer, nitrogen inlet/exhaust, internal low temperature thermometer and septum inlet was added 1-bromo-4-tert-butyl-benzene (1.817 g, 8.53 mmol, 4.1 eq.) and anhydrous THF (20 mL). The resulting solution was cooled to −78° C. n-Butyllithium (2.5M in hexanes) (3.41 mL, 8.53 mmol, 4.1 eq.) was added dropwise via syringe maintaining the internal temperature below −65° C. The reaction mixture was allowed to stir at <−70° C. for 3 hours before the addition of the methyl ester 5 (1.70 g, 2.08 mmol, 1.0 eq.) in anhydrous THF (20 mL), again allowing the internal temperature to remain below −65° C. The solution was allowed to warm slowly to room temperature over 18 hours.

Toluene (50 mL) was added to the reaction mixture and the solution poured into deionized water (300 mL). The mixture was stirred at room temperature for 30 mins and the phases separated. The aqueous phase was extracted with toluene (2×20 mL) and the organic phases combined. The toluene phases were concentrated to dryness in vacuo and a solid remained.

Purification of the product using silica gel chromatography with hexanes to 5% diethyl ether in hexanes gradient afforded the product 6 as a white solid. HPLC indicated a mixture of ring-closed and ring-opened products, 90% overall purity and a purified yield of 1.1 g (41%).

Ring Closure of 6 to 7

The mixture from the previous stage, compound 6 (1.1 g) was dissolved in glacial acetic acid (20 mL) in a 100 mL round bottom flask equipped with magnetic stirrer and hydrochloric acid (1 mL) added. The solution was heated at reflux for 16 hours when TLC indicated complete conversion.

The solution was poured into deionized water (30 mL) and toluene (30 mL) added. The resulting mixture was stirred at room temperature for 15 mins and the phases separated. The aqueous phase was extracted with a further 20 ml of toluene and the organic phases combined. The toluene phases were dried over magnesium sulphate and the solvent removed from the filtrates in vacuo. The crude solid was dried in vacuo to afford a white solid at 92% HPLC purity (12.3 minutes retention time).

The product 7 was recrystallised from a mixture of toluene and acetonitrile to afford the product at a HPLC purity of 97.54%. Further purification from the same solvent mixture afforded the product 7 at a purity sufficient for polymerisation.

2. Procedures for the Synthesis of Monomer 2

The overall synthetic sequence for the synthesis of Monomer 2 is as follows:

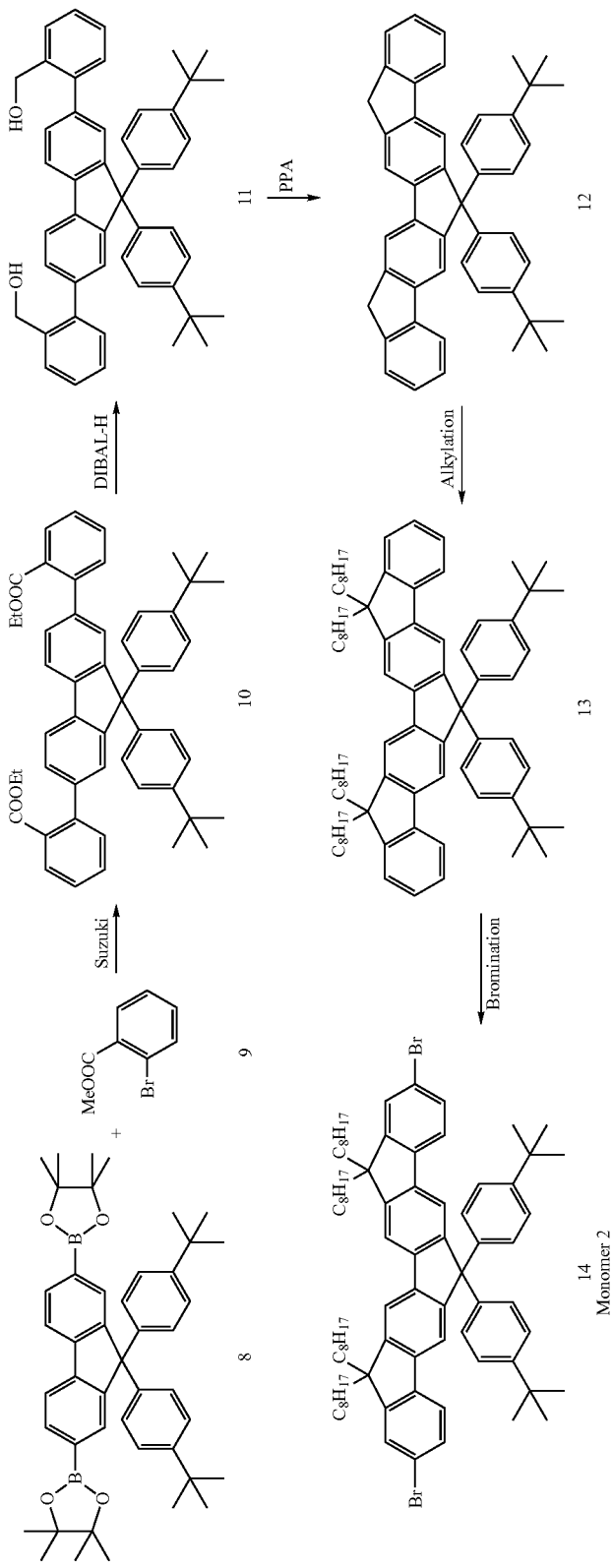

The individual steps in the above synthetic sequence are described below.

Suzuki Product 10

To a 1 L three-neck round bottom flask equipped with mechanical overhead stirrer, reflux condenser, nitrogen inlet/exhaust was added the bis(pinacol) ester (8) (50.0 g, 73.3 mmol, 1.0 eq.), bromoethylbenzoate (9) (30 g, 157.0 mmol, 2.14 eq.), toluene (300 mL) and Aliquat (RTM) 336 (0.5 g). The resulting solution was degassed by sparging with nitrogen for 1 hour at room temperature after which time the stirrer was started and the flask placed under a positive nitrogen pressure. The catalyst, dichlorobis(triphenylphosphine)palladium(II) (0.41 g, 0.59 mmol, 0.008 eq.) was then added, followed by stirring for 15 mins at room temperature under nitrogen. The base, sodium carbonate (36.05 g, 340 mmol, 4.64 eq.) in deionised water (200 mL) was then added and the solution heated to reflux for 16 hours. After this time, TLC indicated the reaction to be complete. The phases were separated and the aqueous phase extracted with toluene (250 mL). The combined toluene phases were filtered through celite (RTM) filter agent and the celite (RTM) washed with toluene (1000 mL). The filtrates were then concentrated to dryness in vacuo.

The crude product was triturated from hexanes and the product harvested by filtration using Buchner apparatus. The cake was washed with hexanes (250 mL) and dried in vacuo for 24 hours. The product, 10, was isolated as a white solid (42.3 g, 82%). HPLC showed retention time 11.98 and a purity of 92.57%.

Reduction Product 11

To a 500 mL 3-neck round bottom flask equipped with mechanical overhead stirrer, nitrogen inlet/exhaust, low temperature thermometer and pressure equalised dropping funnel was added the diester 10 (18.5 g, 26.0 mmol, 1.0 eq.) and dichloromethane (185 mL). The resulting solution was stirred at room temperature under nitrogen and DIBAL-H (1M in hexanes) (132 mL, 132.0 mmol, 5.0 eq.) added dropwise via the dropping funnel. After complete addition, the reaction mixture was stirred at room temperature overnight. After this time, TLC (mini work-up) indicated the reaction to be complete. The mixture was poured slowly into a 10% w/v aqueous solution of Rochelles salt. The layers were separated after stirring vigorously at room temperature for 30 mins. The aqueous phase was extracted again with DCM (250 mL). The combined DCM layers were washed with water (250 mL) and then concentrated to dryness in vacuo.

The product 11 was purified by trituration from hexanes. The product was isolated using Buchner apparatus and the cake washed with hexanes (300 mL). The product was dried in vacuo for 24 hours. Yield (12.1 g, 72%). HPLC showed one peak at Rt 9.46 minutes (99.29% purity).

Cyclisation Product 12

To a 50 mL round-bottomed flask, equipped with magnetic stirrer bar and nitrogen inlet/exhaust was added the diol 11 (1.5 g, 2.0 mmol, 1.0 eq.) and dichloromethane (15 mL). The solution was stirred at room temperature and trifluoromethanesulfonic acid (1.05 g, 7.0 mmol, 3.0 eq.) added carefully. The colour of the solution changed from pale green to black. The solution was stirred for 1 hour at room temperature before diluting with toluene (50 mL) and quenching into water (50 mL). The products were extracted with toluene and the organic phase concentrated to dryness in vacuo.

The mixture was then triturated with IPA (50 mL) and the product recovered by filtration. The cake was washed with fresh IPA (25 mL), air died, then dried in vacuo for 24 hours. The product 12 was afforded as a white solid (0.8 g, 72%).

Alkylation Product 13

To a 1 L 3-necked round-bottomed flask equipped with low temperature thermometer, mechanical overhead stirrer, nitrogen inlet/exhaust and septum cap inlet was added 12 (1.0 g, 1.6 mmol, 1.0 eq.) and anhydrous THF (10 mL). The resulting solution was cooled to −78° C. under nitrogen and n-butyllithium (2.5M in hexanes) (1.65 mL, 4.1 mmol, 2.5 eq.) added dropwise by syringe. The resulting solution was allowed to warm to room temperature over 1 h, and then re-cooled to −78° C. Octylbromide (0.8 g, 4.1 mmol, 2.5 eq.) was added and the solution allowed to warm to room temperature over 16 hours.

After this time, the solution was cooled to −78° C. and a second aliquot of n-butyllithium (2.5M in hexanes) (1.65 mL, 4.1 mmol, 2.5 eq.) added dropwise by syringe. The resulting solution was allowed to warm to room temperature over 1 hour, and then re-cooled to −78° C. Octylbromide (0.8 g, 4.1 mmol, 2.5 eq.) was added and the solution allowed to warm to room temperature over 16 hours.

TLC indicated the reaction to be complete. The reaction was quenched by the dropwise addition of anhydrous HCl in diethyl ether (2M) (5.0 mL, 10 mmol, 6.0 eq.). The solution was concentrated to dryness in vacuo and the excess reagents removed by Kugelrohr distillation. The resulting crude product was purified by column chromatography using hexanes. The product 13 was afforded as a white solid (0.75 g, 70%). HPLC showed an Rt of 13.253 minutes.

Bromination Product 14

The monomer precursor 13 (0.5 g, 0.474 mmol, 1.0 eq.) was dissolved in dichloromethane (2 mL) in a 25 mL round-bottomed flask equipped with magnetic stirrer and nitrogen inlet/exhaust. The solution was cooled to 0° C. and bromine (0.1 mL, 1.18 mmol, 2.5 eq.) added dropwise via a micro syringe. The resulting solution was stirred in the dark for 24 hours, when TLC indicated the reaction to be complete.

The solution was poured into sodium carbonate (20% aqueous) solution (50 mL) and the products extracted into toluene (2×25 mL). The toluene phases were combined and washed with 10% aqueous sodium thiosulfate solution (2×30 mL), water (2×30 mL) and then concentrated to dryness in vacuo. Purification using a small silica gel column (hexanes as eluant) afforded the product as an off-white solid (0.4 g, 75%).

HPLC showed a new retention time of Rt 8.591. Purification to the required standard for polymerisation was performed by repeated crystallisation from acetonitrile and toluene mixtures.

Other diindenofluorene monomers and heteroatomic analogues according to the present invention were prepared in an analogous manner to that described above for Monomer 1 and Monomer 2. Some of the monomers prepared were as follows:

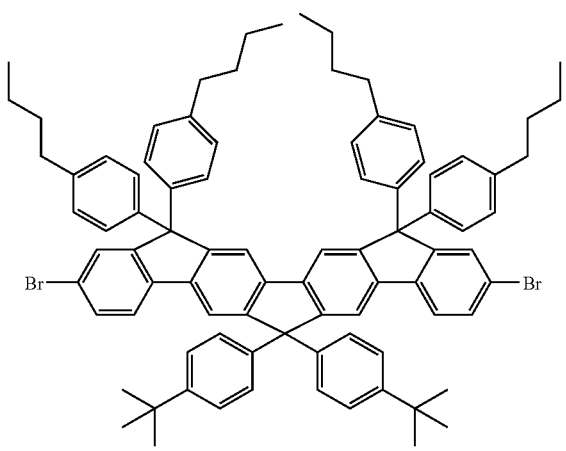

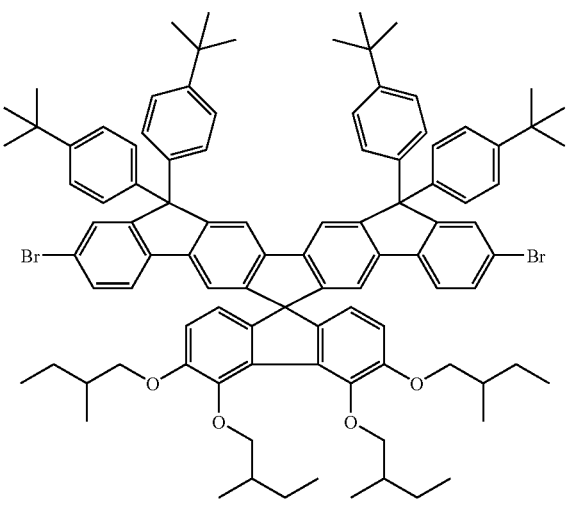

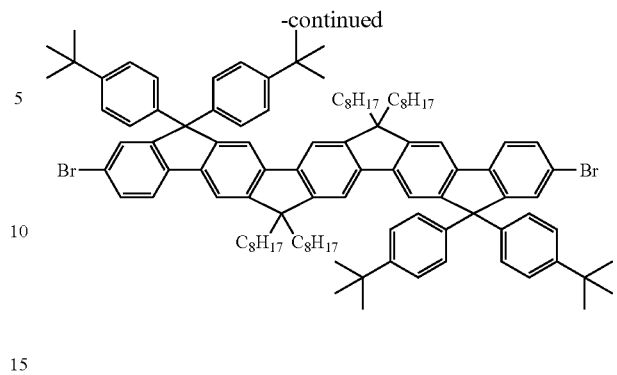

Polymer Examples

Polymer 1

A blue electroluminescent polymer comprising Monomer 1 (48 mol %), "Spirofluorene" (50 mol %) and "BTA" (2 mol %) was prepared by Suzuki polymerisation in accordance with the method set forth in WO 00/53656. For the purpose of comparison, an identical polymer, Comparative Polymer 1, was prepared except that Monomer 1 was replaced by the "Alkyl-indenofluorene" monomer.

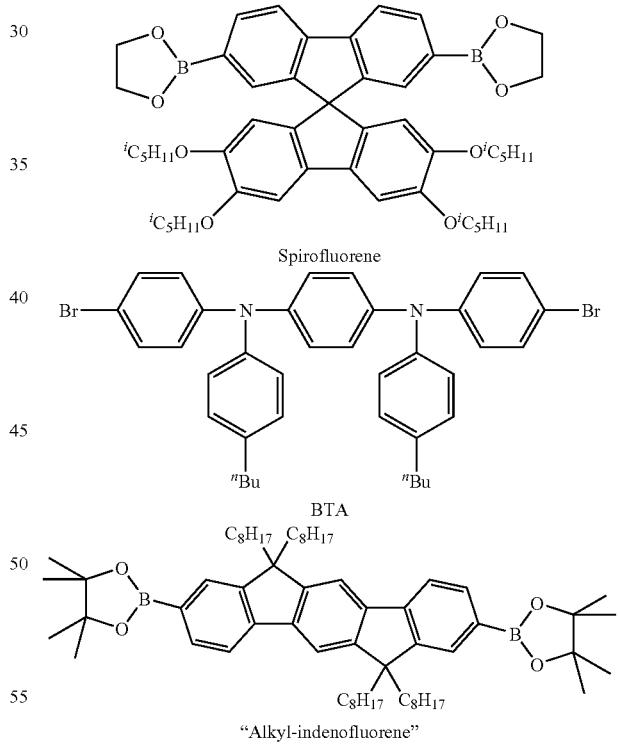

Polymer 2

A blue electroluminescent polymer comprising Monomer 1 (50 mol %), "Alkyl-lndenofluorene" (48 mol %) and "BTA" (2 mol %) was prepared by Suzuki polymerisation in accordance with the method set forth in WO 00/53656.

For the purpose of comparison, an identical polymer, Comparative Polymer 2, was prepared except that Monomer 1 was replaced by the "Alkyl-aryl-indenofluorene" monomer.

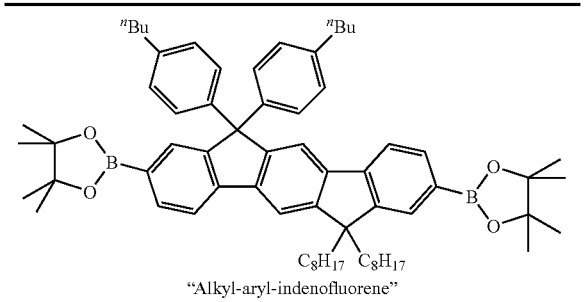

"Alkyl-aryl-indenofluorene"

| Polymer | LUMO | CIE (x,y) |
|---|---|---|
| Polymer 1 | −2.38 | 0.20, 0.20 |
| Comparative Polymer 1 | −2.31 | 0.16, 0.22 |
| Polymer 2 | −2.27 | 0.194, 0.192 |
| Comparative Polymer 2 | −2.16 | 0.17, 0.14 |

Polymer 3

A blue electroluminescent polymer comprising Monomer 1 (48 mol %), "Cis-Alkyl-Indenofluorene" (50 mol %) and "BTA" (2 mol %) was prepared by Suzuki polymerisation in accordance with the method set forth in WO 00/53656.

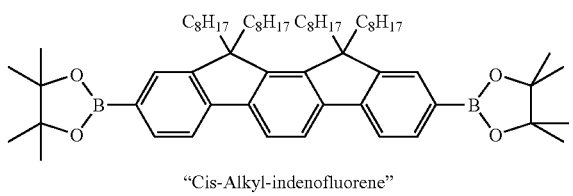

"Cis-Alkyl-indenofluorene"

Polymer 4

A blue electroluminescent polymer comprising Monomer 1 (50 mol %), "PENTAPHENEYLENE" (50 mol %) and "BTA" (2 mol %) was prepared by Suzuki polymerisation in accordance with the method set forth in WO 00/53656.

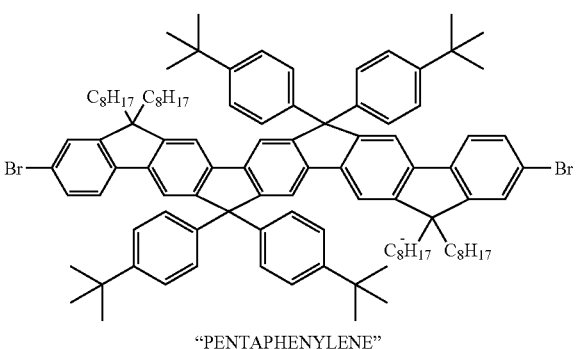

"PENTAPHENYLENE"

As can be seen from these results, polymers comprising a repeat unit according to the invention possess a deeper LUMO level than comparative polymers, without significantly affecting the colour of emission.

Polymers according to the invention are therefore capable of providing good electron transporting properties for electroluminescent polymers, including wide bandgap materials such as blue electroluminescent materials.

Although the present invention has been described in terms of specific exemplary embodiments, it will be appreciated that various modifications, alterations and/or combinations of features disclosed herein will be apparent to those skilled in the art without departing from the spirit and scope of the invention as set forth in the following claims.

The invention claimed is:

1. A polymer comprising an optionally substituted first repeat unit of formula (1):

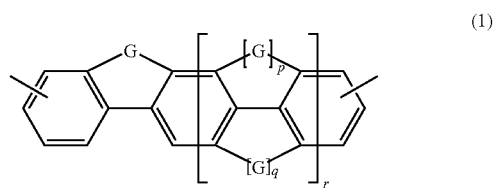

wherein

G is independently on each occurrence a divalent residue;

r is at least 1;

p and q are 0 or 1, wherein when p is 0, q is 1 and when p is 1, q is 0; and when r is 1, G comprises a heteroatom.

2. A polymer according to claim 1, wherein r is at least 2.

3. A polymer according to claim 1, wherein G is independently on each occurrence selected from the group consisting of $CR_2$, NR, PR, POR, BR, O, S, SO, $SO_2$, and $SiR_2$, wherein each R independently represents H or a substituent.

4. A polymer according to claim 1, wherein r is 1 and G is independently on each occurrence selected from the group consisting of NR, PR, POR, BR, O, S, SO, $SO_2$, and $SiR_2$.

5. A polymer according to claim 3, wherein r is greater than 1.

6. A polymer according to claim 3, wherein R is independently on each occurrence selected from the group consisting of H, $C_1$ to $C_{40}$ alkyl, alkoxy, aryl, aryloxy, heteroaryl and heteroaryloxy.

7. A polymer according to claim 3, wherein at least one G is $CR_2$ or $SiR_2$, wherein said R groups are linked to form a ring.

8. A polymer according to claim 1, further comprising a second repeat unit.

9. A polymer according to claim 8, wherein said second repeat unit is an optionally substituted triarylamine or an optionally substituted heteroaromatic.

10. A polymer according to claim 1, wherein at least two adjacent divalent residues G are in a cis-configuration relative to each other.

11. A polymer according to claim 1, wherein at least two adjacent divalent residues G are in a trans-configuration relative to each other.

12. A polymer according to claim 1, wherein a first pair of adjacent divalent residues G are in a trans-configuration relative to each other and a second pair of adjacent divalent residues G are in a cis-configuration relative to each other.

13. An organic electronic device comprising a polymer according to claim 1.

14. An organic electronic device according to claim 13, wherein the polymer is located in a layer between a first electrode for injection of holes and a second electrode for injection of electrons.

15. An organic electronic device according to claim 13, wherein said organic electronic device is an electroluminescent device.

16. An organic electronic device according to claim 13, wherein said organic electronic device is a switching device.

17. A field effect transistor comprising an insulator having a first side and a second side; a gate electrode located on the first side of the insulator; a polymer according to claim 1 located on the second side of the insulator; and a drain electrode and a source electrode located on the oligomer or polymer.

18. An integrated circuit comprising a field effect transistor according to claim 17.

19. A process for preparing the polymer of claim 1 comprising reacting a first monomer comprising an optionally substituted compound of formula (2):

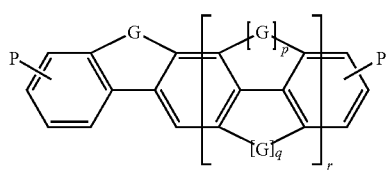

(2)

wherein
G is independently on each occurrence a divalent residue;
r is at least 1;
p and q are 0 or 1, wherein when p is 0, q is 1 and when p is 1, q is 0;
P is independently on each occurrence a polymerizable group; and
when r is 1, G comprises a heteroatom;
with a second monomer that may be the same or different from said first monomer under conditions so as to polymerize said monomers.

20. A process for preparing the polymer of claim 1 comprising polymerizing in a reaction mixture:
(a) a monomer comprising an optionally substituted compound of formula (2):

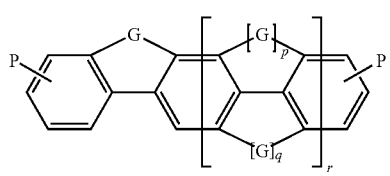

(2)

wherein
G is independently on each occurrence a divalent residue;
r is at least 1;
p and q are 0 or 1, wherein when p is 0, q is 1 and when p is 1, q is 0;
wherein when r is 1, G comprises a heteroatom; and
wherein P is independently on each occurrence a polymerizable group selected from the group consisting of boronic acid groups, boronic ester groups, and borane groups,
and an aromatic monomer having at least two reactive functional groups independently selected from the group consisting of reactive halide groups and groups of formula —O—SO$_2$—Z, wherein Z is selected from the group consisting of optionally substituted alkyl and optionally substituted aryl; or (b) a monomer comprising an optionally substituted compound of formula (2):

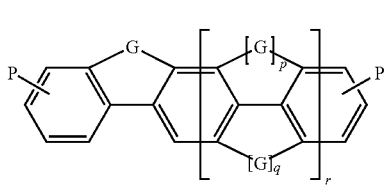

(2)

wherein
G is independently on each occurrence a divalent residue;
r is at least 1;
p and q are 0 or 1, wherein when p is 0, q is 1 and when p is 1, q is 0;
wherein when r is 1, G comprises a heteroatom; and
wherein P is independently on each occurrence a polymerizable group selected from the group consisting of reactive halide groups and groups of formula —O—SO$_2$—Z, wherein Z is selected from the group consisting of optionally substituted alkyl and optionally substituted aryl;
and an aromatic monomer having at least two groups selected from the group consisting of boronic acid groups, boronic ester groups and borane groups; or (c) a monomer comprising an optionally substituted compound of formula (2):

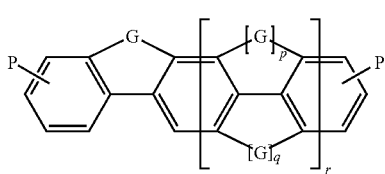

(2)

wherein
G is independently on each occurrence a divalent residue;
r is at least 1;
p and q are 0 or 1, wherein when p is 0, q is 1 and when p is 1, q is 0;
wherein when r is 1, G comprises a heteroatom; and
wherein one P is a reactive halide group or a group of formula —OSO$_2$—Z, wherein Z is selected from the group consisting of optionally substituted alkyl and optionally substituted aryl, and the other P is selected from the group consisting of from boronic acid groups, boronic ester groups, and borane groups; and
wherein said reaction mixture comprises a catalytic amount of a catalyst suitable for catalyzing the polymerization of the aromatic monomers.

* * * * *

UNITED STATES PATENT AND TRADEMARK OFFICE
CERTIFICATE OF CORRECTION

| | | |
|---|---|---|
| PATENT NO. | : 7,592,622 B2 | Page 1 of 1 |
| APPLICATION NO. | : 11/659899 | |
| DATED | : September 22, 2009 | |
| INVENTOR(S) | : Mary McKiernan et al. | |

It is certified that error appears in the above-identified patent and that said Letters Patent is hereby corrected as shown below:

Title Page item 57
In the Abstract, line 2, "unit off formula (1): wherein F is a divalent residue; each G in" should read -- unit of formula (1): wherein F is a divalent residue; each G in --.

In the Specification, column 1, on line 47, "devices, see for example WO90113148" should read -- devices, see for example WO90/13148 --.

In the Specification, columns 9 and 10, "iso-OC5H11" should read -- iso-$OC_5H_{11}$ --.

In the Specification, column 12, on line 5, "palldium (e.g. palladium acetate) (Organic Letters," should read -- palladium (e.g. palladium acetate) (Organic Letters, --.

In the Specification, column 12, on line 38, "Appi. Phys. 1996, 79, 934; fluorine repeat units as disclosed" should read -- Appl. Phys. 1996, 79, 934; fluorine repeat units as disclosed --.

In the Specification, column 24, on line 6, "fresh IPA (25 mL), air died, then dried in vacuo for 24 hours." should read -- fresh IPA (25 mL), air dried, then dried in vacuo for 24 hours. --.

In the Specification, column 27, on line 40, "1 (50 mol %), "PENTAPHENEYLENE" (50 mol %) and" should read -- 1 (50 mol %), "PENTAPHENYLENE" (50 mol %) and --.

Signed and Sealed this
Eighteenth Day of October, 2011

David J. Kappos
*Director of the United States Patent and Trademark Office*